United States Patent
Brabec et al.

(10) Patent No.: US 7,781,670 B2
(45) Date of Patent: Aug. 24, 2010

(54) ORGANIC PHOTOVOLTAIC COMPONENT WITH ENCAPSULATION

(75) Inventors: Christoph Brabec, Linz (AT); Jens Hauch, Erlangen (DE)

(73) Assignee: Konarka Technologies, Inc., Lowell, MA (US)

( * ) Notice: Subject to any disclaimer, the term of this patent is extended or adjusted under 35 U.S.C. 154(b) by 469 days.

(21) Appl. No.: 11/169,558

(22) Filed: Jun. 29, 2005

(65) Prior Publication Data

US 2006/0000506 A1    Jan. 5, 2006

(30) Foreign Application Priority Data

Jul. 2, 2004    (DE)    .................. 10 2004 032 202

(51) Int. Cl.
H01L 31/048    (2006.01)

(52) U.S. Cl. .................. 136/251; 136/259; 136/263; 136/252

(58) Field of Classification Search ......... 313/243–265; 136/243–265
See application file for complete search history.

(56) References Cited

U.S. PATENT DOCUMENTS

| | | | | |
|---|---|---|---|---|
| 4,371,739 A | * | 2/1983 | Lewis et al. ............... | 136/251 |
| 4,398,055 A | * | 8/1983 | Ijaz et al. .................. | 136/258 |
| 4,617,195 A | * | 10/1986 | Mental ....................... | 427/66 |
| 4,672,149 A | * | 6/1987 | Yoshikawa et al. ......... | 136/263 |
| 4,754,544 A | * | 7/1988 | Hanak ........................ | 438/66 |
| 5,468,988 A | * | 11/1995 | Glatfelter et al. ........... | 257/431 |
| 5,679,176 A | * | 10/1997 | Tsuzuki et al. ............. | 136/251 |
| 5,771,562 A | * | 6/1998 | Harvey et al. .............. | 29/592.1 |
| 6,198,217 B1 | | 3/2001 | Suzuki et al. | |
| 6,239,352 B1 | * | 5/2001 | Luch .......................... | 136/244 |
| 6,278,055 B1 | * | 8/2001 | Forrest et al. .............. | 136/263 |
| 2003/0000568 A1 | * | 1/2003 | Gonsiorawski ............. | 136/251 |
| 2003/0164497 A1 | * | 9/2003 | Carcia et al. .................. | 257/40 |
| 2003/0205845 A1 | * | 11/2003 | Pichler et al. ........... | 264/272.11 |
| 2004/0029311 A1 | * | 2/2004 | Snyder et al. ............... | 438/106 |
| 2004/0033375 A1 | | 2/2004 | Mori | |
| 2004/0046497 A1 | | 3/2004 | Shaepkens et al. | |
| 2004/0212299 A1 | * | 10/2004 | Ishikawa et al. ............ | 313/505 |

FOREIGN PATENT DOCUMENTS

| | | |
|---|---|---|
| EP | 0 350 907 | 1/1990 |
| EP | 0 468 440 | 1/1992 |
| EP | 0 566 736 | 10/1993 |
| WO | WO 2004/046497 | 6/2004 |
| WO | WO 2006/003133 | 1/2006 |
| WO | WO 2007/013120 * | 7/2006 |

OTHER PUBLICATIONS

Material Data Sheet for 3M 1181 EMI Shielding Tape retrieved from www.3m.com on Nov. 18, 2009.*

* cited by examiner

Primary Examiner—Nam X Nguyen
Assistant Examiner—Bach T Dinh
(74) Attorney, Agent, or Firm—Fish & Richardson P.C.

(57) ABSTRACT

The invention concerns an organic photovoltaic component with a novel encapsulation, wherein the invention for the first time discloses packaging for organic solar cells that includes a low-cost film composite comprising a metal portion. The packaging meets high requirements, particularly with respect to
- high barrier properties against oxygen and water vapor
- encapsulation without or with only minimal adhesive joints, since the encapsulation can be welded/soldered to the substrate or the bottom electrode,
- integrated lead-through of electrical connections, including adhesive-bonded, soldered and/or welded connections.

21 Claims, 1 Drawing Sheet

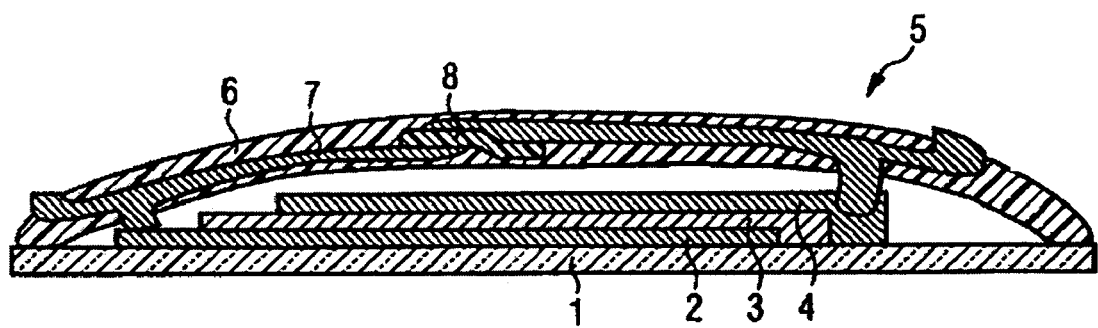

ORGANIC PHOTOVOLTAIC COMPONENT WITH ENCAPSULATION

CROSS-REFERENCE TO RELATED APPLICATION

This application claims priority under 35 U.S.C. +517 119 to German patent application Ser. No. 102004032202.3, filed Jul. 2, 2004, which is hereby incorporated by reference.

The invention concerns an organic photovoltaic component with a novel encapsulation.

As a rule, organic photovoltaic components are sensitive to environmental influences. To protect them against damage, the components, which usually include at least a substrate, an at least semitransparent bottom electrode, at least one organic photovoltaic functional layer and a top electrode, are completely coated or encapsulated. Many encapsulation methods are known, including placing entire dimensionally stable caps over the component and applying film coatings to the component and connecting them sealingly to the substrate.

The material used for such encapsulations is usually a synthetic or a glass, the essential requirements for the material being mechanical stability and barrier properties or tightness against moisture and/or air. Unfortunately, no ideal solutions to this problem have yet emerged in terms of the material used for the encapsulation, since materials that possess high tightness are usually lacking in mechanical stability and vice versa. Two especially critical factors with respect to tightness are the transition from the encapsulation to the substrate, although this problem has largely been solved by a wide variety of adhesive bonding and screw connection techniques; and the location in the encapsulation through which the contacts pass. In particular, the adhesive bonding of two glass plates always entails an adhesive joint that leads to permeation by gases/water.

The object of the invention is to make available an organic photovoltaic component with an encapsulation that combines mechanical stability with tightness and can nevertheless be produced simply and in a manner that lends itself to mass production.

This object is achieved by means of the subject matter of the independent claims and the associated dependent claims in combination with the description, and by means of the subject matter of the FIGURE.

The invention is directed to an organic photovoltaic component comprising an encapsulation, a substrate, an at least semitransparent bottom electrode, at least one organic, photovoltaically active functional layer and a top electrode plus the corresponding electrical contacts, wherein the encapsulation comprises at least one layer made of a metal composite material. The invention is further directed to a method of producing an organic photovoltaic component comprising an encapsulation, a substrate, a bottom electrode, at least one functional layer and a top electrode plus the corresponding electrical contacts, having at least the following method steps:

applying an at least semitransparent bottom electrode to a substrate applying at least one organic, photovoltaically active functional layer to the bottom electrode, applying a top electrode and encapsulating the entire component with a metal composite material and connecting the encapsulation to the substrate and/or to a bottom layer of the component.

In one embodiment of the method, the encapsulation is either welded, adhesive-bonded and/or soldered to the substrate. In this case, the encapsulation is sealed, for example, by the low-cost welding of metal film to the substrate. The synthetic material layer of the encapsulation can also be connected to the substrate.

The electrodes can be placed in contact with a voltage and/or current source by being contacted through the encapsulation, either by welding or through the use of a low-temperature solder. Depending on the embodiment, a subregion of the film will have an exposed metal region to be used for contacting, thus ensuring a low contact resistance.

In an advantageous embodiment of the invention, at least one of the through-connections of the component is made through the metal portions of the metal composite material. The good barrier properties, high mechanical stability and electrical conductivity of the metal of the encapsulation are used to best advantage in this way.

The metal composite material is a synthetic material or a glass that contains metal in some form. It can be a polymer filled with metal fibers, metal chips and/or other metal particles, but there can also be a layer structure containing alternating layers of metal, synthetic material or glass, for example in the form of ultra-thin films. The metal can also be present in the synthetic material or glass or as a layer or laminate in the form of fusible alloys, i.e. in the form of low-melting metal alloys.

In cases where both through-connections, that of the top and that of the bottom electrode, have been laid through the encapsulation, an electrically isolating portion must be present inside the metal composite forming the encapsulation to keep the two conductors electrically separated from each other.

The term "conductor" herein is to be construed as broadly as need be and not as limited to a continuous, i.e. gapless or solid, metallic conductor, since, for example, metallic-particle-filled synthetic materials can also go to make up the conductors.

The metal composite material according to the invention can be used to make components comprising either rigid or flexible encapsulations, the latter also being referred to under some circumstances as seals.

This object is achieved by means of the subject matter of the independent claims and the associated independent claims in combination with the description, and by means of the subject matter of the FIGURE.

The encapsulations preferably are in the thin and ultra-thin film range, i.e., have for example a thickness of 200 μm, preferably 75 μm and particularly preferably 30 μm.

In one embodiment, an encapsulation is produced by means of layer structure in which synthetic layers alternate with metal layers in a film composite and form a flexible encapsulation. This makes it possible in particular for the through-connections to be integrated into the encapsulation, since the two metal layers of the through-connections can be separated from each other effectively by layers of electrically isolating synthetic material to prevent short circuits. The metal layers of the through-connections can simultaneously contribute to the tightness and mechanical stability of the encapsulation.

The following layers, for example, can be applied one on top of the other: flexible film of a kind that can also be used as a substrate, metal film, flexible film. This film composite has high barrier properties against oxygen and water vapor, and the contacts can be led through the encapsulation into the metal layers of the encapsulating film composite.

Depending on the embodiment, for example a subregion of the film has an exposed metal region for contacting, thus resulting in a low contact resistance.

The encapsulation can, for example, be connected directly to the bottom and/or the top electrode instead of to the substrate. In this case, the encapsulation is connected to the component via contact with the at least semitransparent electrode and/or is connected to the top electrode through a layer that is isolated from the semitransparent electrode. The invention is described in further detail hereinbelow with reference to a FIGURE depicting an embodiment of the invention.

Recognizable at the bottom is a substrate 1, which can be either a flexible film or a rigid support, such as, for example, glass or quartz or the like. Disposed thereon is the bottom electrode 2, which is transparent so that radiation can pass through it to the active functional layer(s). According to one embodiment, at least one of the electrodes is nanostructured.

Disposed thereon is at least one photovoltaically active organic functional layer 3, which can be made from a wide variety of materials, depending on the component. The upper seal is formed by the top electrode 4. The component can, for example, be surmounted by a so-called topcoat, i.e. a protective film, which for the first time gives the component protection against non-ultra-clean-room conditions, making it possible for the encapsulation to be applied under normal manufacturing and/or production conditions.

Around the entire component and tightly connected to the substrate 1 is the encapsulation 5, comprising a metal composite material. The encapsulation leads the two contacts of the component outward through its metal portion. The encapsulation 5 comprises a synthetic portion 6 that is also present in particular at the location 8 where the two current-carrying metal portions 7 coming from opposite poles overlap. The metal portions 7 guide the contacts of both electrodes outward through the encapsulation.

In one embodiment, getter materials are inserted (sandwiched) between the encapsulating film and the element. Getter materials are materials that react very strongly with water molecules and oxygen atoms and bind and/or chemically neutralize them if they penetrate into the element. Examples of getter materials are zeolite and calcium oxide for water molecules and iron oxide for oxygen.

In one embodiment, getter materials are incorporated directly into the film.

The topcoat can be made from organic (parylene), inorganic (silicon dioxide, aluminum oxide, silicon nitride ($SiN_x$), etc.) or alternatively from a film composite with a hybrid structure (organic/inorganic).

BRIEF DESCRIPTION OF THE DRAWING

FIG. 1 is a cross-sectional view of an electronic component.

The invention discloses for the first time the packaging of organic solar cells by means of a low-cost film composite that includes a metal portion. The packaging meets high requirements, particularly with respect to high barrier properties against oxygen and water vapor
encapsulation without or with only minimal adhesive joints, since the encapsulation can be welded/soldered to the substrate or the bottom electrode,
integrated lead-through of electrical connections, including adhesive-bonded, soldered and/or welded connections.

The invention claimed is:

1. A photovoltaic component, comprising:
an encapsulation, comprising:
  a first electrically isolating portion;
  a second electrically isolating portion;
  a third electrically isolating portion;
  a first metal portion between the first and second electrically isolating portions; and
  a second metal portion between the first and second electrically isolating portions,
a substrate,
a bottom electrode,
at least one functional layer, and
a top electrode,
wherein:
  the top electrode and the bottom electrode are between the substrate and the first electrically isolating portion of the encapsulation,
  the top electrode and the bottom electrode are between the substrate and the second electrically isolating portion of the encapsulation,
  the top electrode and the bottom electrode are between the substrate and the third electrically isolating portion of the encapsulation,
  the encapsulation is welded, adhesive-bonded and/or soldered to the substrate or a bottom layer of the photovoltaic component,
  the bottom electrode is electrically connected to the first metal portion,
  the top electrode is electrically connected to the second metal portion,
  the third electrically isolating portion electrically isolates the first metal portion from the second metal portion,
  the encapsulation encapsulates the first and second electrodes and the at least one functional layer; and
  the photovoltaic component is an organic photovoltaic component.

2. The photovoltaic component according to claim 1, wherein the encapsulation is welded, adhesive-bonded and/or soldered to the substrate.

3. The photovoltaic component according to claim 1, wherein a subregion of the encapsulation has an exposed metal region outside of the encapsulation for contacting.

4. The photovoltaic component according to claim 1, wherein the encapsulation has a thickness of at most 200 microns.

5. The photovoltaic component according to claim 1, wherein the component further comprises a protective layer.

6. The photovoltaic component according to claim 1, wherein the encapsulation further comprises a getter material.

7. The photovoltaic component according to claim 1, wherein the encapsulation comprises alternating layers of metal and synthetic material or glass.

8. The photovoltaic component of claim 1, further comprising first and second electrical contacts, wherein the first electrical contact electrically connects the top electrode and the first metal portion, and the second electrical contact electrically connects the bottom electrode and the second metal portion.

9. The photovoltaic component according to claim 8, wherein at least one member selected from the group consisting of the encapsulation, the first electrical contact and the second electrical contact comprises a low-temperature solder.

10. A photovoltaic component, comprising:
a photovoltaic cell, comprising:
  a substrate;
  a first electrode; and
  a second electrode; and
an encapsulation comprising:
  a first electrically isolating portion;
  a second electrically isolating portion;

a third electrically isolating portion;
a first metal portion between the first and second electrically isolating-portions; and
a second metal portion between the first and second electrically isolating portions,
wherein:
  the first electrode is electrically connected to the first metal portion the second electrode is electrically connected to the second metal portion,
  the third electrically isolating portion electrically isolates the first metal portion from the second metal portion,
  the first electrode and the second electrode are between the substrate and the first electrically isolating portion of the encapsulation,
  the first electrode and the second electrode are between the substrate and the second electrically isolating portion of the encapsulation,
  the first electrode and the second electrode are between the substrate and the third electrically isolating portion of the encapsulation, and
  the encapsulation is tightly connected to the substrate or a bottom layer of the photovoltaic component.

11. The photovoltaic component of claim 10, wherein the encapsulation is welded, adhesive-bonded and/or soldered to at least one component of the photovoltaic cell.

12. The photovoltaic component of claim 10, wherein the electrically isolating portion comprises glass or a polymer.

13. The photovoltaic component of claim 12, wherein alternating layers of the encapsulation comprise metal.

14. The photovoltaic component of claim 10, wherein the encapsulation has a thickness of at most 200 microns.

15. The photovoltaic component of claim 10, wherein the encapsulation has a thickness of at most 75 microns.

16. The photovoltaic component of claim 10, wherein the encapsulation further comprises a getter material.

17. The photovoltaic component of claim 10, wherein the encapsulation is welded, adhesive-bonded and/or soldered to the substrate or to a bottom layer of the photovoltaic component.

18. The photovoltaic component of claim 10, further comprising first and second electrical contacts, wherein the first electrical contact electrically connects the first electrode and the first metal portion, and the second electrical contact electrically connects the second electrode and the second metal portion.

19. The photovoltaic component of claim 18, wherein the first electrical contact comprises metal fibers, metal chips and/or other metal particles.

20. A photovoltaic component, comprising:
a substrate.
a first electrode;
at least one functional layer;
a second electrode; and
an encapsulation that encapsulates the first and second electrodes and the at least one functional layer, the encapsulation comprising:
  a first electrically isolating portion;
  a second electrically isolating portion;
  a third electrically isolating portion;
  a first metal portion between the first and second electrically isolating portions; and
  a second metal portion between the first and second electrically isolating portions,
wherein:
  the first electrode is electrically connected to the first metal portion,
  the second electrode is electrically connected to the second metal portion,
  the third electrically isolating portion electrically isolates the first metal portion from the second metal portion,
  the first electrode and the second electrode are between the substrate and the first electrically isolating portion of the encapsulation,
  the first electrode and the second electrode are between the substrate and the second electrically isolating portion of the encapsulation,
  the first electrode and the second electrode are between the substrate and the third electrically isolating portion of the encapsulation, and
  the photovoltaic component is an organic photovoltaic component.

21. The photovoltaic component of claim 20, further comprising first and second contacts, wherein the first contact is electrically connected to the first electrode, and the second contact is electrically connected to the second electrode.

* * * * *

UNITED STATES PATENT AND TRADEMARK OFFICE
CERTIFICATE OF CORRECTION

PATENT NO. : 7,781,670 B2 Page 1 of 1
APPLICATION NO. : 11/169558
DATED : August 24, 2010
INVENTOR(S) : Christoph Josef Brabec et al.

It is certified that error appears in the above-identified patent and that said Letters Patent is hereby corrected as shown below:

Column 1,
Line 7, delete "+517" and insert -- § --

Column 6,
Line 8, delete "substrate." and insert -- substrate; --

Signed and Sealed this

Second Day of November, 2010

David J. Kappos
*Director of the United States Patent and Trademark Office*